United States Patent [19]

Burton et al.

[11] Patent Number: 4,972,105

[45] Date of Patent: Nov. 20, 1990

[54] PROGRAMMABLE CONFIGURABLE LOGIC MEMORY

[75] Inventors: Dennis A. Burton, Linthicum; Wendy L. Goble, Gambrills; Robert D. Morelli, Columbia; Thomas B. Phelps, Laurel, all of Md.

[73] Assignee: The U.S. Government as represented by the Director, National Security Agency, Fort George G. Meade, Md.

[21] Appl. No.: 411,331

[22] Filed: Sep. 22, 1989

[51] Int. Cl.$^5$ .................. G11C 7/00; H03K 19/096; H03K 19/003; H03K 3/01

[52] U.S. Cl. .................. 307/468; 307/202.1; 364/716; 365/225.7

[58] Field of Search .......... 307/465, 468, 469, 202.1; 364/716; 365/96, 225.7; 340/825.87, 825.91

[56] References Cited

U.S. PATENT DOCUMENTS

| | | | |
|---|---|---|---|
| 4,336,601 | 6/1982 | Tanaka | 307/465 |
| 4,348,737 | 9/1982 | Cukier et al. | 307/465 |
| 4,414,547 | 11/1983 | Knapp et al. | 307/465 |
| 4,631,686 | 12/1986 | Ikawa et al. | 340/825.87 |
| 4,730,130 | 3/1988 | Baskett | 364/716 X |
| 4,791,602 | 12/1988 | Resnick | 364/716 X |
| 4,796,229 | 1/1989 | Greer, Jr. et al. | 364/716 X |
| 4,881,202 | 11/1989 | Tsujimoto et al. | 365/225.7 X |
| 4,894,558 | 1/1990 | Conkle et al. | 364/716 X |
| 4,910,418 | 3/1990 | Graham et al. | 365/96 X |
| 4,912,345 | 3/1990 | Steele et al. | 307/468 X |
| 4,912,348 | 3/1990 | Maki et al. | 307/468 X |
| 4,937,475 | 6/1990 | Rhodes et al. | 364/716 X |

Primary Examiner—Stanley D. Miller
Assistant Examiner—David R. Bertelson
Attorney, Agent, or Firm—Thomas O. Maser; John R. Utermohle

[57] ABSTRACT

A reprogrammable logic array is characterized by the use of a RAM fuse to selectively control the transfer of variable from input lines to intersecting output combination lines of the array. The configuration of the combiner array is programmed by writing to all of the RAM locations that are associated with the array. If a connection is to be made, a logical "1" is written to the RAM cell for that connection and if no connection is desired, a "0" is written to the RAM cell. The array which includes a novel input interface, can be quickly and easily reprogrammed simply by writing to the appropriate RAM cells. The RAM fuses may function as standard static RAM if the device does not need to function as a combiner.

9 Claims, 4 Drawing Sheets

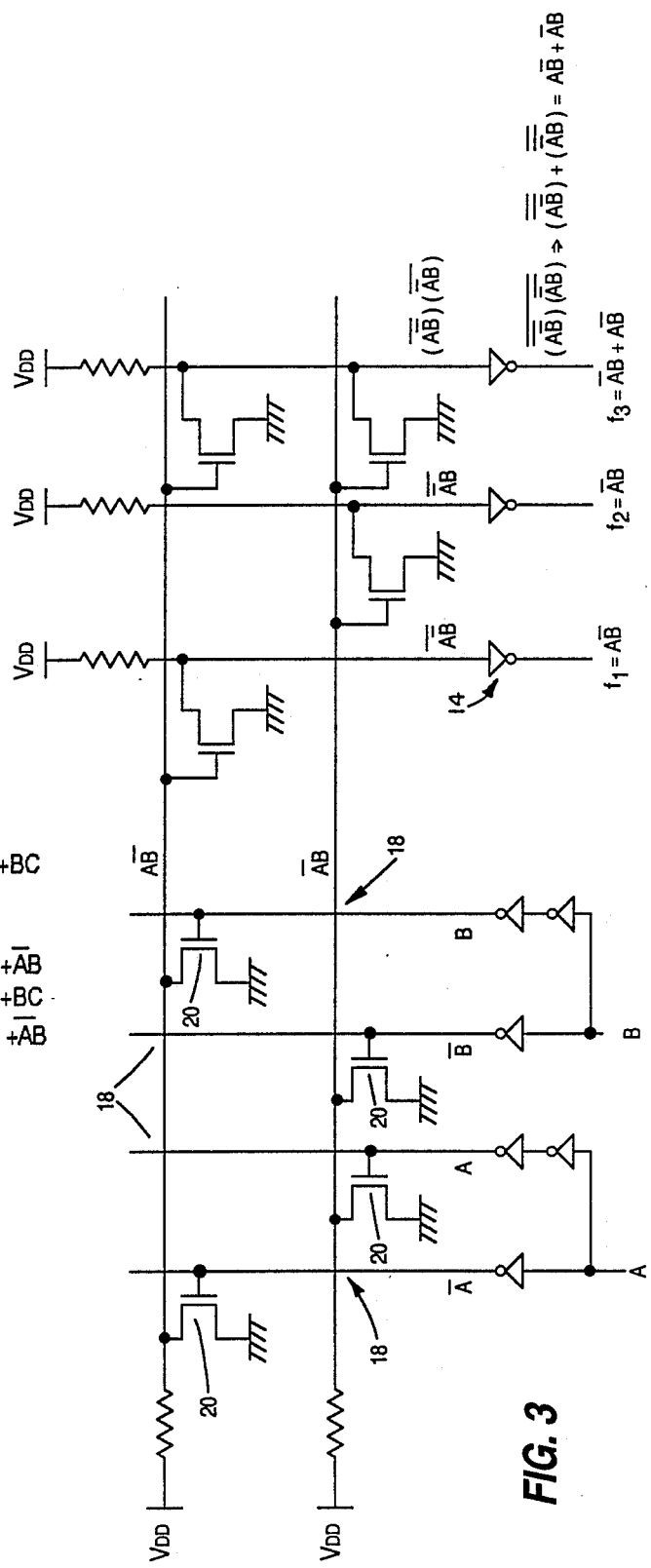
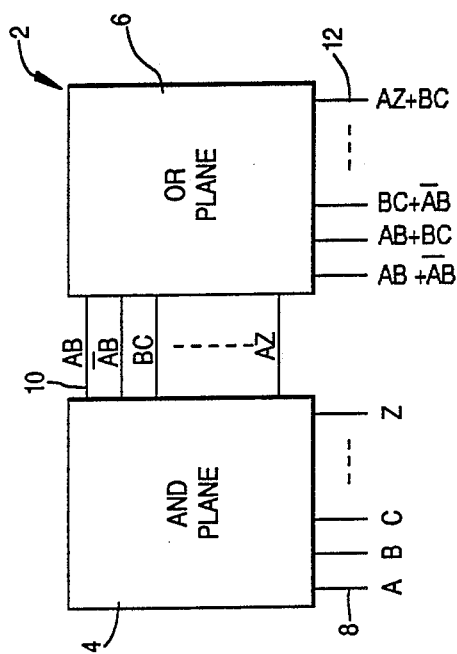
FIG. 1 (PRIOR ART)
FIG. 3
FIG. 4

PROGRAMMABLE CONFIGURABLE LOGIC MEMORY

BACKGROUND OF THE INVENTION

The present invention relates to a reprogrammable combiner, and more particularly to an improved programmable logic device (PLD) wherein a random access memory (RAM) is combined with a fuse-like switch to define a RAM cell which is substituted for each fuse of a standard PLD. By selectively programming the RAM cells, the logic array can be configured in any desired manner. Furthermore, the array can be reconfigured merely by reprogramming the RAM cells.

BRIEF DESCRIPTION OF THE PRIOR ART

One method of implementing a programmable combiner is to use a RAM look-up table to perform the desired function. The inputs into the combiner are treated as addresses into the RAM. The correct result must be predetermined and stored at the appropriate address. Although RAM tables are easy to reprogram, the size of the table depends on the number of inputs. If the number of inputs increases, the size of the RAM table soon becomes prohibitively large. For example, a 32 bit input would require about 4.3 gigabits of memory to store the RAM table.

Another way to implement a programmable combiner is to use a programmable logic device (PLD). The PLD is much more efficient than RAM but suffers due to the fact that it is usually not reprogrammable. A PLD is essentially a logical AND/OR combiner device which is programmed by blowing fuses arranged at the intersections of input lines and combination (i.e. sum or product) lines. The fuses connect internal lines of the array to transistors connected to ground. Any function expressed in sum of products form can be implemented if the array is large enough by blowing the correct fuse. Normally, however, the PLD can only be programmed once, either during fabrication or by the user, and is thus not reconfigurable.

Rewritable programmable logic devices are known in the patented prior art as evidenced by the patents to Tanaka No. 4,336,601 and Cukier et al No. 4,348,737. The Tanaka patent, for example, discloses a device which can dynamically alter logic functions by loading a word pattern in order to realize specific logic functions into memory cells. Each cell structure of the device is identified with the structure of a RAM. The Cukier et al patent discloses a programmable logic array using RAM in place of read only memories. Personalization of the RAM is achieved by loading a prescribed data pattern into first and second memories. The memories are loaded by storing "1" bits in positions corresponding to those which would be connected in a read only memory and "0" bits in the other positions.

Finally, it is known in the art to provide a programmable logic device which contains embedded erasable programmable read only memories (EPROM's). A major drawback of this type of device is that reconfiguration is a time consuming process. Furthermore, the EPROM device requires the extra step of erasing an old value before adding a new value to reconfigure the array. With a RAM cell, it is only necessary to write over the old information for reconfiguration.

The present invention was developed in order to overcome these and other drawbacks of the prior devices by providing a programmable logic device including a plurality of RAM cells which can be selectively programmed to configure the array in any desired manner.

SUMMARY OF THE INVENTION

Accordingly, it is a primary object of the present invention to provide a reprogrammable logic array including a plurality of rows of output combination lines and a plurality of columns of input lines intersecting with the combination lines. Each input line is supplied with a different input variable. A RAM fuse is connected with each intersection of combination and input lines. The RAM fuses are individually reprogrammable to selectively transfer input variables from the input lines to the combination lines in order to produce on each output line a desired combination of input variables.

According to a more specific objection of the invention, two arrays of lines are provided, with the output lines of one array being connected with the input lines of the other.

It is yet a further objection of the invention to provide a switching device connected with each of the input lines for transferring the input variables to the combination lines. In one embodiment, the switching device comprises a separate transistor connected with each RAM fuse for each combination line. In another embodiment the switching device comprises a single transistor connected with each of the input lines, respectively.

In accordance with another object of the invention, each RAM fuse comprises a RAM cell and a transistor which operates as a fuse and whose state is controlled by data stored in the RAM cell.

Finally, it is an object of our invention to provide an array in which RAM cells not required for the programmable combiner can be used as ordinary RAM.

BRIEF DESCRIPTION OF THE FIGURES

Other objects and advantages of the present invention will become apparent from a study of the following specification when viewed in the light of the accompanying drawing, in which:

FIG. 1 is a simplified block diagram of a programmable logic array (PLA);

FIG. 3 is an example of a conventional PLD programmed to produce a specific output by blowing selected fuses;

FIG. 4 is a table representing the outputs of the PLD of FIG. 3 for various input variables;

DETAILED DESCRIPTION

The programmable logic device will be described in general with reference to FIG. 1. The device 2 is formed of two interconnected arrays, one of which is an AND plane 4 and the other of which is an OR plane 6. The AND plane 4 includes a plurality of input lines 8 for receiving a plurality of input variables A–Z, respectively. The AND plane 4 also includes a plurality of combination output lines 10 on which combinations of input variables are provided. The output lines 10 are connected as input lines to the OR plane 6. The OR plane includes a plurality of output lines 12 on which the combined output terms appear.

Figure 2:
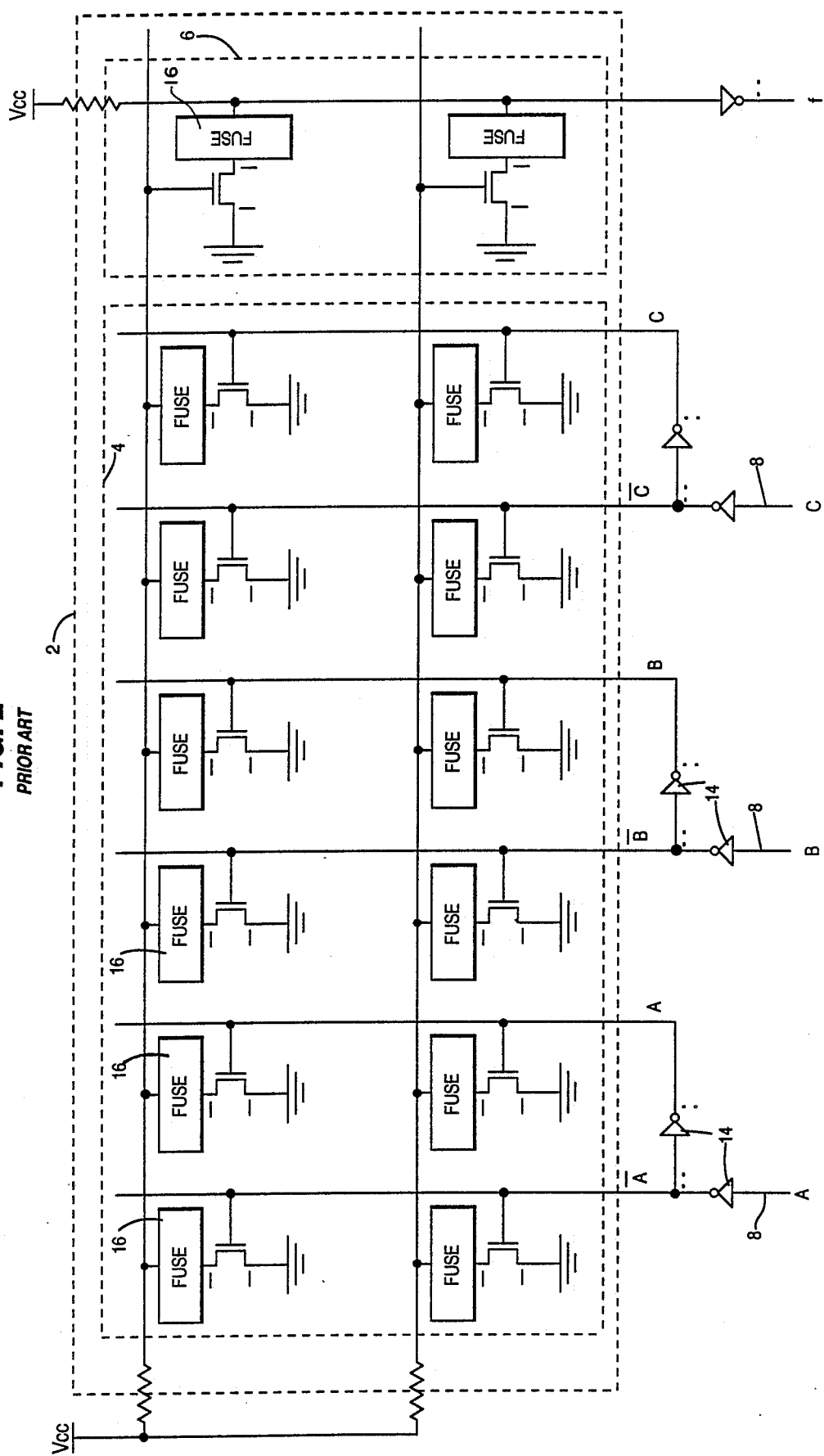
FIG. 2 is a more detailed schematic diagram of a conventional programmable logic device.

In FIG. 2, there is shown a more detailed schematic diagram of the device of FIG. 1. As shown therein, the AND plane 4, of which only a portion is shown, comprises a plurality of columns of input lines 8 which intersect a plurality of combination output lines 10 representing the product of selected input variables. Inverters 14 may be provided to produce complementary input variables A–Z, and $\overline{A}$–$\overline{Z}$. The OR plane 6, of which only a portion is shown similarly comprises an array of intersecting input and combination lines. At each intersection of each planar array is provided a fuse 16. By blowing selected fuses, the AND plane is programmed to produce the desired list of product terms that contain the variables and the complement of the variables. The fuses are typically blown by the users. Since a blown fuse can not be reset, programming of the device is essentially a one-time operation. The OR plane is similar in structure to the AND plane with the exception that its inputs are the product terms produced from the AND plane and its outputs are a group of signals that are functions of product terms summed together as desired.

Referring now to FIG. 3, there is shown an example of a PLD with certain of the fuses blown, resulting in open circuits that create disconnections as shown at intersections 18. Where the fuses are not blown, the transistors 20 are operable to provide a short or an open circuit depending on the logical input to the transistor. Conceptually the inverters 14 are perceived as producing a complementary output. Thus a logical "1" input to an inverter 14 produces a logical "0" output. Furthermore, a logical "1" applied to a transistor 20 of N-type produces a short circuit while a logical "0" applied to the transistor produces an open circuit. The outputs f1–f3 of the device of FIG. 3 are as follows:

$$f1 = A\overline{B}$$

$$f2 = \overline{A}B$$

$$f3 = A\overline{B} + \overline{A}B$$

The resistor pullup on each combination line supplied with VDD provides the "1"p level when all the transistors in a row are off. If one transistor in a row is on, this is sufficient to pull the row low to provide the "0" level.

Figure 5:
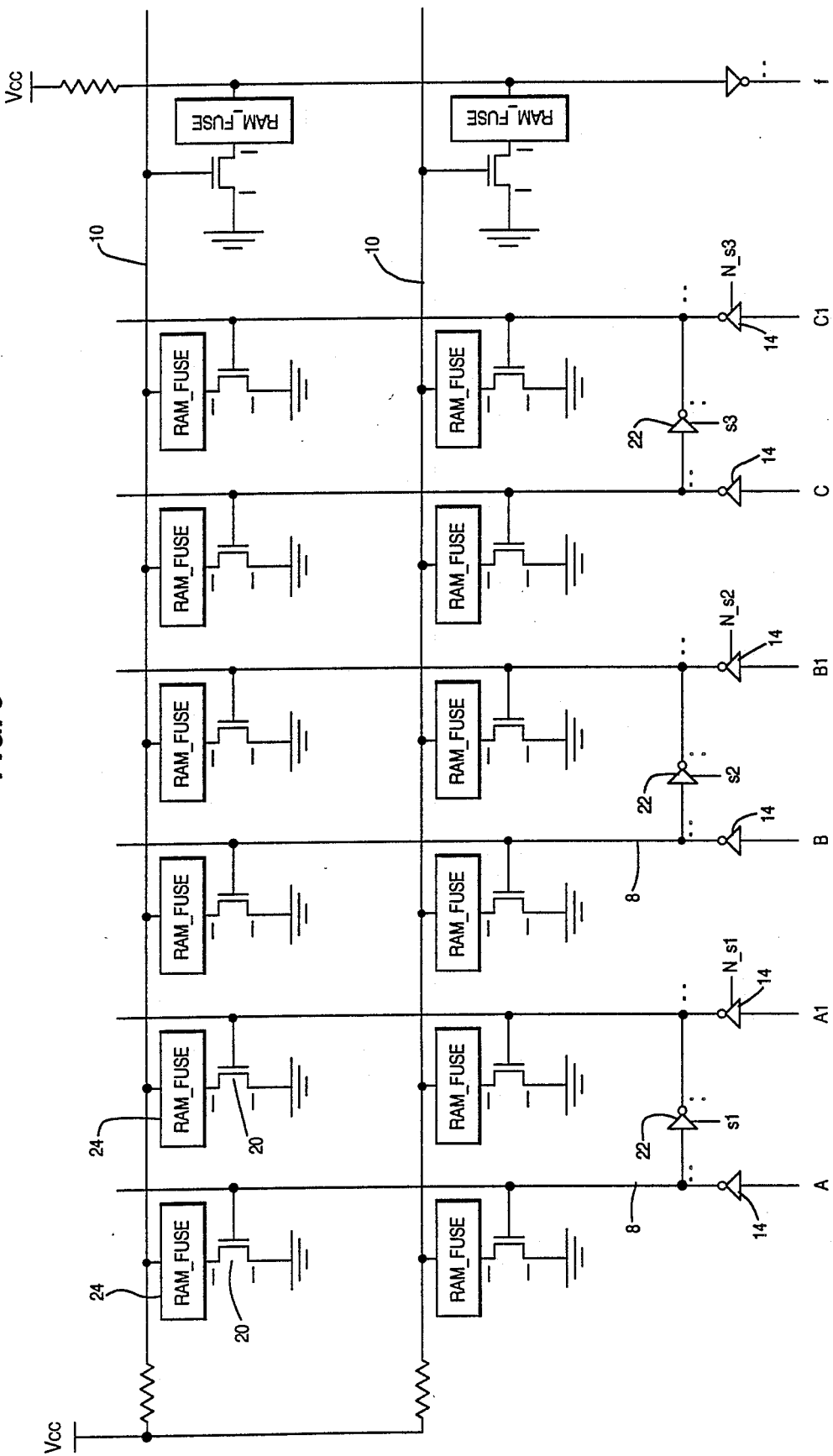
FIG. 5 is a schematic diagram of a programmable configurable logic array according to the invention.

The programmable configurable logic memory array according to the invention is shown in FIG. 5. As in the prior device of FIG. 2, each array includes a plurality of rows of combination lines which define the output lines 10 of the array and a plurality of columns of input lines 8 intersecting with the rows of combination lines. Each input line has a different input variable A, A1, B, B1, etc. and the array is programmed to produce as outputs selected combinations of the input variables as will be developed below.

Connected with each input line 8 is an inverter 14 for producing complementary values of the input variables. Furthermore, a second inverter 22 is connected between adjacent pairs of input lines. The second inverters are selectively operated to control the input variables and complementary variables for each of the pairs of input lines.

Connected at each intersection of an input column line 8 and an output combination lines 10 is a RAM fuse 24 and a transistor switch 20. The RAM fuse and switch operate to control the transfer of an input variable from an input line to an output combination line at that intersection. As will be developed below, the RAM fuses are independently reprogrammable to selectively transfer the input variables to the combination lines to produce on each output line a desired combination of input variables.

Figure 6A:
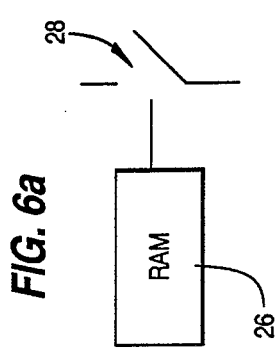
FIG. 6a is a simplified block diagram of a RAM fuse in accordance with the invention.

FIG. 6a illustrates in simplistic form a RAM fuse according to the invention. Essentially, the RAM fuse comprises a random access memory 26 and a switch 28. The switch performs the function of the fuse 16 in the standard PLD of FIG. 2. When the RAM applies a logical "0" on the gate of the switch 28, the switch is open (i.e. its drain is not connected to its source) and when the RAM applies a logical "1" on the gate of the switch, the switch is closed. An open circuited switch conceptually may be thought of as being absent.

Figure 6B:
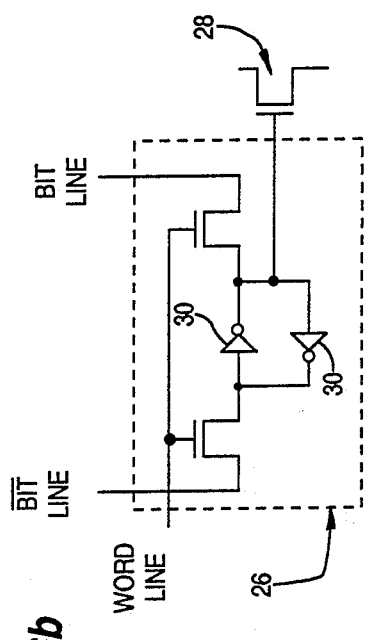
FIG. 6b is a detailed schematic diagram of a RAM fuse.

Referring now to FIG. 6b, the RAM cell is shown in more detail. The RAM 26 is a standard six transistor static RAM. In FIG. 6b, the inverters 30 each represent a pair of p- and n- channel transistors connected as is known to those of ordinary skill in the art. The p-channel transistor acts complementary to the N-channel transistor.

The RAM 26 of each RAM fuse 24 can be selectively programmed, and reprogrammed, by placing a logical "1" or "0" thereon. To write a "1" to the RAM cell 26, place a '1' on the BIT line and "0" on the $\overline{BIT}$ line. Data is stored when the WORD line is raised. The stored data remains when the WORD line is lowered. To write a "0" to the RAM cell, place a "0" on the BIT line and a "1" on the $\overline{BIT}$ line. Data is stored when the WORD line is raised. The stored data remains when the WORD line is lowered.

In order to read the RAM cell (with "1" or "0" in it), precharge the BIT and $\overline{BIT}$ lines to 2.5 V. Then let them float with no fixed value and raise the WORD line. The data stored in the RAM will be put onto the BIT lines while the complement of the data will be put on the $\overline{BIT}$ lines. The RAM cell BIT and $\overline{BIT}$ lines are fed into a sense amplifier such as a comparator to produce the final output as is known in the art. The output controls the state of the transistor 28 (i.e. open or closed).

With the circuit of FIG. 5, the desired array configuration can be selected. More particularly, if the desired configuration requires that a connection be made between an input line and an output line, a "1" is written to the RAM cell for that connection or intersection. If no connection is desired, a "0" is written to the RAM cell to open the switch 28. The combiner array is configured by writing to all the RAM locations that are associated with the array. The array can be quickly and easily reprogrammed by writing to the appropriate RAM cells. Rapid reprogramming is necessary in order to quickly reconfigure the operation of the combiner.

In a preferred embodiment, two or more planar arrays are interconnected to define a desired combiner. For example, the array of FIG. 5 may comprise an AND plane wherein the combination output lines 10 produce product terms. This plane may be connected with an OR plane where the output lines of the AND plane are connected with the input lines of the OR plane. The combination lines of the OR plane produce sum terms in a manner described above with reference to FIGS. 1 and 2.

Figure 7:
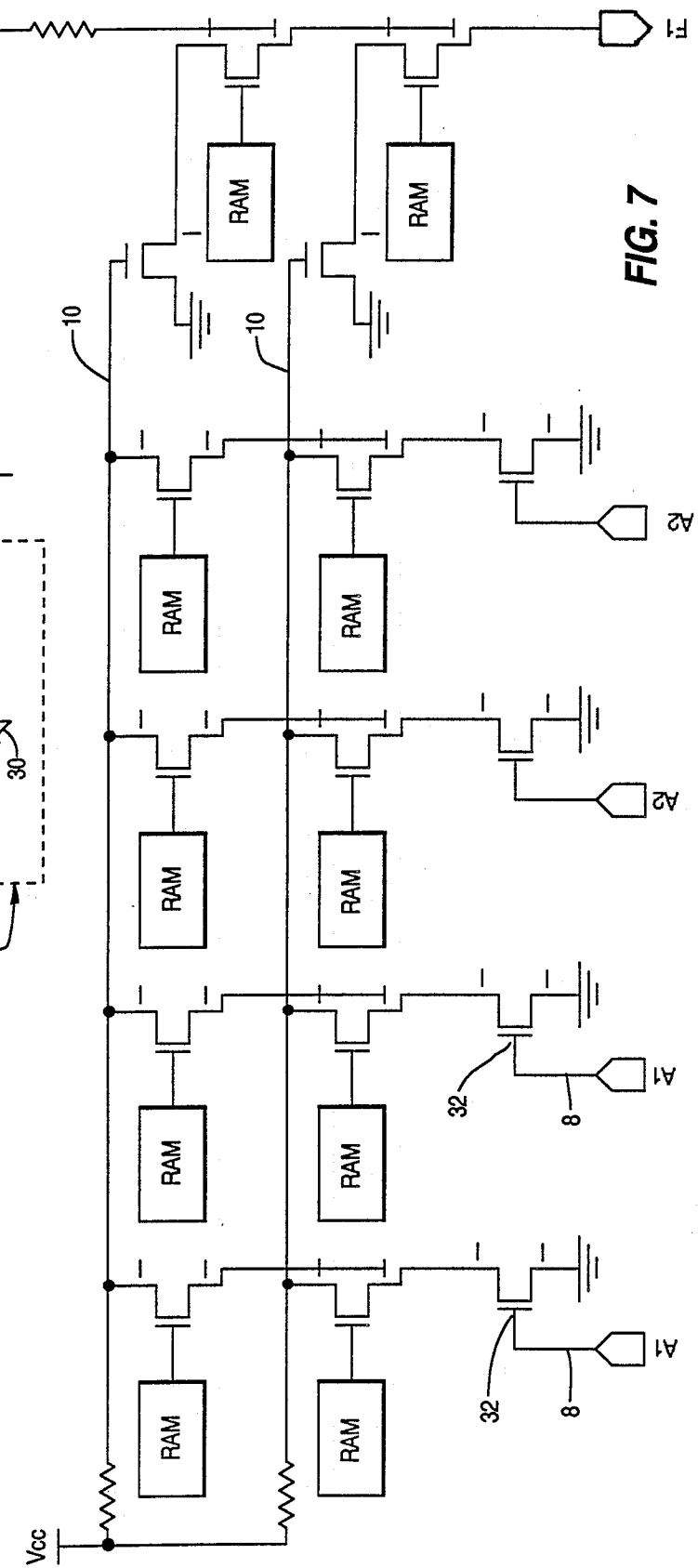
FIG. 7 is a schematic diagram of an alternate embodiment of the programmable configurable logic array according to the invention.

In order to simplify the circuitry and reduce its size, it is possible to combine all of the transistors connected with an input signal or variable in a column into a single transistor 32 as shown in FIG. 7. As shown in the embodiment of FIG. 5, the data in the RAM switch determines the connectivity of the AND and OR planes and therefore the output functions.

The input lines may have the inverters arranged in either of the configurations shown in FIG. 2 or FIG. 5 to provide the option of having both the input variable and its complement available (FIG. 2) or the ability to eliminate the complement and replace it with a new uncomplemented signal variable (FIG. 5, with the inverters 22 disabled). The option of FIG. 2 provides an AND and OR term with complemented values which is typical of prior programmable logic arrays. The option of FIG. 5 allows a larger (i.e. double) number of uncomplemented signal variables which results in a savings in circuit area.

The reprogrammable PLA according to the invention provides a number of other advantages over the prior devices. An inherent characteristic of RAM is that when the array is turned off, the configuration of the device would be lost. This is beneficial if the array configuration is classified or proprietary. Another advantage is that RAM cells can be quickly and easily reprogrammed while still in the circuit. Individual cells can be changed simply by writing over the old value.

One of the most novel aspects of the present invention is that if the array is not needed to operate as a programmable combiner, the RAM cells usually used to configure the array can be used as ordinary RAM. This is a great benefit to chips that are hard pressed to squeeze in as much RAM as possible.

Finally, as noted above, the reprogrammable logic array according to the invention contains a programmable input interface. Normal PLD's take an input and generate both its complemented and double complemented form. In some instances, the double complement form is not needed. This would create a large amount of wasted chip space. The present invention was designed so that each input line can either accept one input and generate both the complemented and double complemented forms, or can be divided into two individual input lines as shown in FIG. 5. This allows what would normally be a 16 input array to accept as many as 32 inputs if it is known that the double complemented form of all of the inputs is never needed. In this configuration, even though the array would function the same as a standard PLD, it only needs to be half the size of a standard PLD.

The reconfigurable logic array device according to the invention is able to perform a variety of cryptographic functions and may quickly and easily switch between these functions.

While in accordance with the provisions of the patent statute the preferred forms and embodiments of the invention have been illustrated and described, it will be apparent to those of ordinary skill in the art that various changes and modifications may be made without deviating from the inventive concepts set forth above.

What is claimed is:

1. A reprogrammable logic array, comprising
   (a) a plurality of rows of combination lines defining the output lines of the array;
   (b) a plurality of columns of input lines intersecting with said rows of combination lines, each of said input lines having a different input variable;
   (c) means connected with each intersection of said combination and input lines for controlling the transfer of an input variable from said input line to said combination line at said intersection;
   (d) said control means being individually reprogrammable by a RAM fuse to selectively transfer the input variables to said combination lines, thereby to produce on each output line a desired combination of input variables.

2. Apparatus as defined in claim 1, and further comprising first and second arrays of lines, the output lines of said first array being connected with the input lines of said second array.

3. Apparatus as defined in claim 2, wherein the output lines of one of said arrays comprise product line and the output lines of the other of said arrays comprise sum lines.

4. Apparatus as defined in claim 3, and further comprising switching means connected with each of said input lines for transferring said input variables to said combination lines.

5. Apparatus as defined in claim 4, wherein said switching means comprises a separate transistor connected with each RAM fuse for each combination line.

6. Apparatus as defined in claim 4, wherein said switching means comprises a single transistor connected with each of said input lines, respectively.

7. Apparatus as defined in claim 1, and further comprising inverter means connected between adjacent pairs of said input lines, respectively, said inverter means being selectively operated to control the input variables and complementary variables for each of said pairs of input lines.

8. Apparatus as defined in claim 1, wherein each RAM fuse comprises a RAM cell and a transistor which operates as a fuse and whose state is controlled by data stored in said RAM cell.

9. Apparatus as defined in claim 8, wherein each RAM cell comprises a six transistor static RAM cell.

* * * * *